(12) United States Patent
Horii

(10) Patent No.: US 7,235,885 B2
(45) Date of Patent: Jun. 26, 2007

(54) SEMICONDUCTOR DEVICE AND METHOD OF MANUFACTURING THE SAME, CIRCUIT BOARD AND ELECTRONIC DEVICE

(75) Inventor: Shingo Horii, Sakoto (JP)

(73) Assignee: Sieko Epson Corporation, Tokyo (JP)

( * ) Notice: Subject to any disclaimer, the term of this patent is extended or adjusted under 35 U.S.C. 154(b) by 0 days.

(21) Appl. No.: 10/968,851

(22) Filed: Oct. 19, 2004

(65) Prior Publication Data

US 2005/0110155 A1 May 26, 2005

(30) Foreign Application Priority Data

Oct. 24, 2003 (JP) ............................ 2003-364199

(51) Int. Cl.
  *H01L 23/52* (2006.01)
  *H01L 23/34* (2006.01)
(52) U.S. Cl. ............... 257/777; 257/723; 257/693; 257/668; 257/776; 257/E23.169; 257/E23.178; 438/67; 438/107; 438/109
(58) Field of Classification Search .................. None
See application file for complete search history.

(56) References Cited

U.S. PATENT DOCUMENTS 6,525,414 B2 * 2/2003 Shiraishi et al. ............ 257/686
6,611,063 B1 * 8/2003 Ichinose et al. ............ 257/784
6,617,695 B1 * 9/2003 Kasatani .................... 257/778
6,774,473 B1 * 8/2004 Shen .......................... 257/686

FOREIGN PATENT DOCUMENTS

| JP | 10-084011 | 3/1998 |
|---|---|---|
| JP | 2001-102512 | 4/2001 |
| JP | 2001-223297 | 8/2001 |

* cited by examiner

Primary Examiner—Jasmine Clark
(74) Attorney, Agent, or Firm—Hogan & Hartson LLP

(57) ABSTRACT

A semiconductor device includes a wiring board having a wiring pattern, a semiconductor chip that has an integrated circuit and is mounted on a first surface of the wiring board to electrically connect with the wiring pattern, a spacer that is disposed on a second surface of the wiring board and has inside thereof an electronic component that is electrically connected with the wiring pattern and an external terminal that is disposed on the second surface and electrically connected with the wiring pattern.

9 Claims, 3 Drawing Sheets

SEMICONDUCTOR DEVICE AND METHOD OF MANUFACTURING THE SAME, CIRCUIT BOARD AND ELECTRONIC DEVICE

BACKGROUND OF THE INVENTION

1. Field of the Invention

The present invention relates to a semiconductor device and a method of manufacturing the same, a circuit board and an electronic device.

2. Detailed Description of Related Art

A semiconductor device that has a semiconductor chip mounted on one surface of a wiring board and an external terminal on the other surface thereof is known. When the semiconductor device is mounted and when the height of the external terminal can be made constant, the reliability of the semiconductor device after mounting can be improved.

An advantage of the present invention is to provide a semiconductor device high in reliability and a method of manufacturing the same, a circuit board and an electronic device.

SUMMARY OF THE INVENTION

A semiconductor device according to an embodiment of the present invention includes a wiring board having a wiring pattern, a semiconductor chip that has an integrated circuit and is mounted on a first surface of the wiring board to electrically connect with the wiring pattern, a spacer that is disposed on a second surface of the wiring board and has inside thereof an electronic component that is electrically connected with the wiring pattern and an external terminal that is disposed on the second surface and electrically connected with the wiring pattern. According to an embodiment of the present invention, on the second surface of the wiring board a spacer and an external terminal are disposed. When the semiconductor device is mounted so that the second surface of the wiring board may face a circuit board, owing to the spacer, a distance between the wiring board and the circuit board can be restricted. Accordingly, the height of the external terminal disposed on the same surface as the spacer can be maintained constant. Furthermore, since the electronic component is disposed inside of the spacer, the spacer can inhibit the electronic component from being displaced or falling off. Thereby, a semiconductor device high in reliability can be provided.

According to an embodiment of the present invention, on a surface that is opposite to a surface that faces the wiring board in the spacer, a recess may be formed. The recess may be disposed avoiding a region that overlaps with the electronic component. The height of the external terminal may be higher than that of the spacer. Thereby, a semiconductor device high in reliability in the electrical connection with the circuit board can be provided.

On the circuit board according to an embodiment of the present invention, the abovementioned semiconductor device is mounted. An electronic device according to an embodiment of the present invention has the abovementioned semiconductor device.

A method of manufacturing a semiconductor device according to an embodiment of the present invention includes preparing a wiring board on a first surface of which a semiconductor chip is mounted and on a second surface of which an electronic component is mounted and forming on the second surface a spacer that seals the electronic component. According to the embodiment of the present invention, on the second surface of the wiring board, a spacer is formed. Accordingly, a semiconductor device that can maintain a distance between the wiring board and the circuit board at a definite value or more when mounting on the circuit board and so on, and is high in reliability can be manufactured. Furthermore, with the electronic component sealed with the spacer, a semiconductor device that can inhibit the electronic component from being displaced or falling off and is high in reliability can be manufactured.

According to the method of manufacturing a semiconductor device, the spacer may be formed so as to have a recess on a surface opposite to a surface that faces the wiring board. The spacer may be formed so as to be disposed avoiding a region where the recess overlaps with the electronic component. On the second surface an external terminal may be further disposed and the external terminal may be formed so as to be higher in height than the spacer.

DETAILED DESCRIPTION OF THE INVENTION

In what follows, embodiments to which the present invention is applied will be explained with reference to the drawings. However, the present invention is not restricted to the embodiments below.

Figure 1:
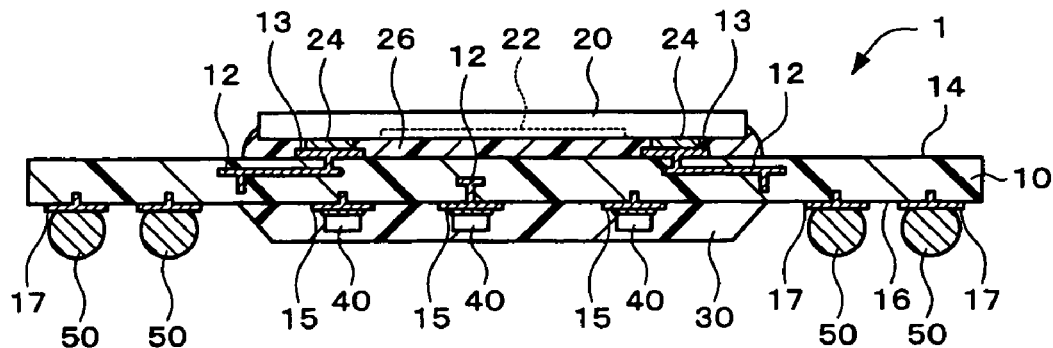
FIG. 1 is a diagram showing a semiconductor device according to an embodiment thereto the present invention is applied.

FIG. 1 is a diagram for explaining a semiconductor device according to an embodiment to which the present invention is applied. FIG. 1 is a sectional view of a semiconductor device according to an embodiment to which the present invention is applied.

A semiconductor device according to the present embodiment has a wiring board 10. A material of the wiring board 10, without restricting to a particular one, may be an organic material (such as epoxy board), an inorganic material (such as a ceramic board and a glass board), or a material having a composite structure thereof (such as a glass/epoxy board). The wiring board 10 may be a rigid board and at this time the wiring board 10 may be called an interposer. Alternatively, the wiring board 10 may be a flexible board such as a polyester board and a polyimide board. Furthermore, the wiring board 10 may be a board for a Chip On Film (COF). The wiring board 10 may be a single layer board made of a single layer or a laminated board having a plurality of laminated layers. The shape and the thickness of the wiring board 10 are not particularly restricted.

The wiring board 10, as shown in FIG. 1, has a wiring pattern 12. The wiring pattern 12 may be formed by laminating any of copper (Cu), chromium (Cr), titanium (Ti), nickel (Ni), titanium-tungsten (Ti—W), gold (Au), aluminum (Al), nickel-vanadium (NiV) and tungsten (W) or of any one layer thereof. The wiring pattern 12 may be formed so as to electrically connect one surface of the wiring board 10 and the other surface thereof. For instance, as shown in FIG. 1, the wiring pattern 12 may have pads 13, 15 and 17. At this time, the pad 13 is a pad that is disposed on one surface of the wiring board 10, and the pads 15 and 17 are pads that are disposed on the other surface of the wiring board 10. By electrically connecting the pad 13 and the pads 15 and 17, the electrical connection between both surfaces of the wiring board 10 may be attained. In the case of a laminated board being prepared as the wiring board 10, the wiring pattern 12 may be disposed between the respective layers. A method of forming the wiring pattern 12 is not particularly restricted. For instance, the wiring pattern 12 may be formed by means of sputtering or the like or an additive method in which the wiring pattern 12 is formed by means of the electroless plating may be applied. The wiring pattern 12 may be plated with solder, tin, gold, nickel or the like.

A semiconductor device according to an embodiment of the present invention has a semiconductor chip 20. The semiconductor chip 20 has an integrated circuit 22 made of a transistor, a memory element or the like. The semiconductor chip 20 is mounted on a first surface 14 of the wiring board 10. In other words, a surface on which the semiconductor chip 20 is disposed in the wiring board 10 may be called a first surface 14. The semiconductor chip 20 is electrically connected with the wiring pattern 12. For instance, as shown in FIG. 1, the semiconductor chip 20 may have an electrode 24, and the electrode 24 may electrically connect the semiconductor chip 20 and the wiring pattern 12. As shown in FIG. 1, the electrode 24 and the pad 13 of the wiring pattern 12 may face each other and may be electrically connected. The pad 13 is a pad that is disposed on the first surface of the wiring board 10. At this time, by the use of a resin portion 26, the semiconductor chip 20 may be solidly adhered to the wiring board 10. However, in the semiconductor device according to the embodiment of the present invention, a mounting mode of the semiconductor chip 20 is not restricted thereto.

A semiconductor device according to an embodiment of the present invention has a spacer 30. The spacer 30 is disposed on a second surface 16 of the wiring board 10. In more detail, the spacer 30 is disposed on a surface opposite to a surface (first surface 14) on which the semiconductor chip 20 of the wiring board 10 is mounted. A material of the spacer 30, without restricting to particular material, may be made of, for instance, a resin. As shown in FIG. 1, only one spacer 30 may be formed on the second surface 16. The spacer 30 has inside thereof an electronic component 40 that is electrically connected with the wiring pattern 12. The electronic component 40 may be electrically connected with the wiring pattern 12 by means of, for instance, solder. As shown in FIG. 1, the electronic component 40, by making use of the pad 15, may be electrically connected with the wiring pattern 12. The pad 15 is a pad disposed on the second surface 16 of the wiring board 10. The electronic component 40, without restricting to a particular electronic component, may be a chip component (such as chip capacitor and chip coil).

A semiconductor device according to the embodiment of the present invention has an external terminal 50. The external terminal 50 is disposed on the second surface 16 of the wiring board 10. The external terminal 50 is electrically connected with the wiring pattern 12. The external terminal 50, as shown in FIG. 1, may be disposed on the pad 17 to be electrically connected with the wiring pattern 12. The external terminal 50 may be, for instance, a solder ball. A height of the external terminal 50 may be higher than a height of the spacer 30. Thereby, when the semiconductor device is mounted on a circuit board (such as mother board), the external terminal 50 and a wiring or the like of the circuit board can be brought into contact. Accordingly, both can be easily electrically connected. The height of the spacer 30 may indicate a height of the spacer 30 from the second surface 16 of the wiring board 10. Furthermore, the height of the external terminal 50 may indicate the height of the external terminal 50 from the second surface 16 of the wiring board 10.

Figure 2:
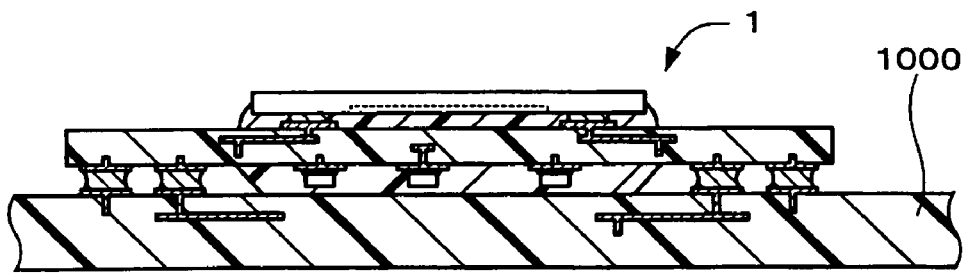
FIG. 2 is a diagram showing a circuit board of which a semiconductor device according to an embodiment thereto the present invention is applied is mounted.

A semiconductor device 1 according to an embodiment of the present invention is constituted as mentioned above. As explained above, the semiconductor device 1 has the spacer 30 disposed on the second surface 16 of the wiring board 10. Accordingly, when the semiconductor device 1 is mounted so that the second surface 16 faces the circuit board, the spacer 30 restricts a distance between the wiring board 10 and the circuit board. Since the external terminal 50 is disposed on the same surface as the spacer 30, after mounting, the dispersion in the height of the external terminal 50 can be made smaller (FIG. 2). When the dispersion of the height of the external terminal 50 is made smaller, the dispersion of the forces applied on the respective external terminals 50 can be made smaller. Accordingly, after mounting, a large force can be inhibited from being applying on a particular external terminal 50 and thereby the reliability of the semiconductor device can be improved.

In FIG. 2, a circuit board 1000 thereon the semiconductor device 1 is mounted is shown. As shown in FIG. 2, the semiconductor device 1 may be mounted so that the spacer 30 comes into contact with the circuit board 1000. In more detail, the semiconductor device 1 may be mounted so that a surface opposite to a surface that faces the wiring board 10 of the spacer 30 may come into contact with the circuit board 1000. Thereby, since the external terminal 50 after mounting can be made to a designated height, the reliability of the semiconductor device can be improved. Furthermore, as explained above, the spacer 30 has inside thereof an electronic component 40. In other words, the electronic component 40 is sealed with the spacer 30. Accordingly, the electronic component 40 can be inhibited from falling off or being displaced.

Figure 3:
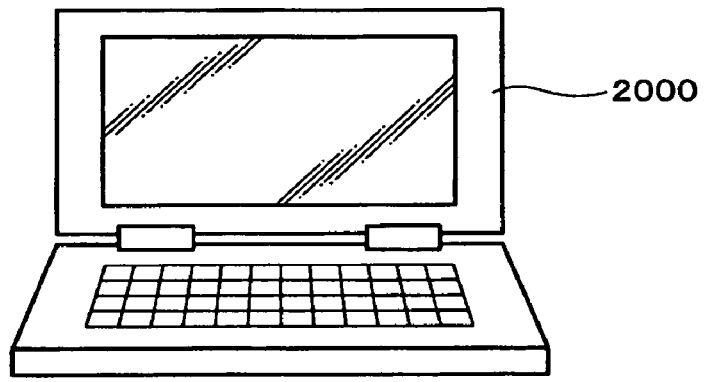
FIG. 3 is a diagram showing an electronic device having a semiconductor device according to an embodiment thereto the present invention is applied.
Figure 4:
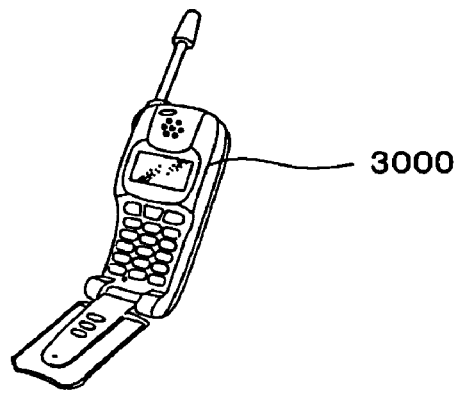
FIG. 4 is a diagram showing another electronic device having a semiconductor device according to an embodiment thereto the present invention is applied.

As electronic devices having the semiconductor device according to the embodiment to which the present invention is applied, FIG. 3 and FIG. 4, respectively, show a note type personal computer 2000 and a portable telephone 3000.

Figure 5:
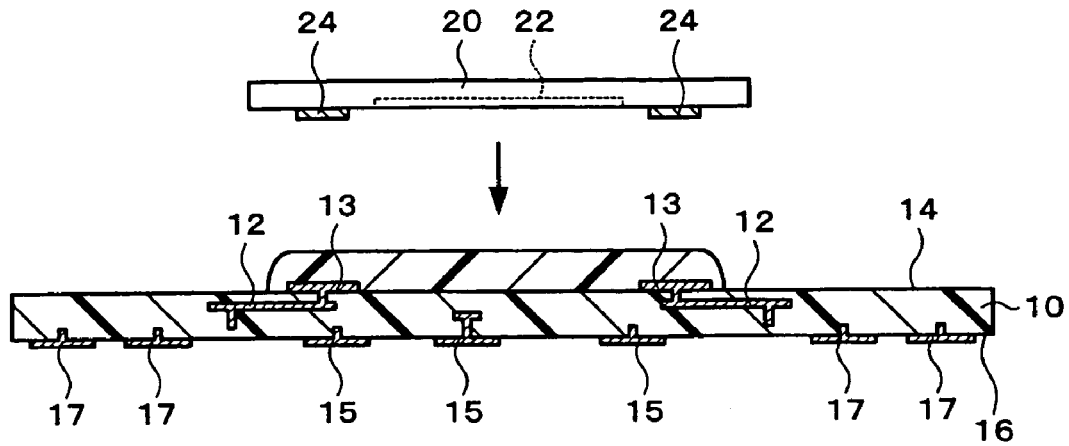
FIG. 5 is a diagram showing a method of manufacturing a semiconductor device according to an embodiment thereto the present invention is applied.

In what follows, a method of manufacturing a semiconductor device according to the embodiment to which the present invention is applied will be explained. FIGS. 5 through 7 are diagrams for explaining a method of manufacturing a semiconductor device according to the embodiment to which the invention is applied.

Figure 6:
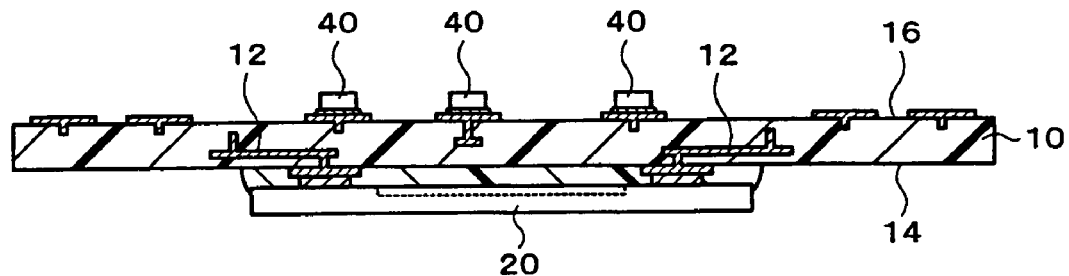
FIG. 6 is a diagram showing another method of manufacturing a semiconductor device according to an embodiment thereto the present invention is applied.

A method of manufacturing a semiconductor device according to an embodiment of the present invention includes preparing a wiring board 10. On a first surface 14 of a wiring board 10, a semiconductor chip 20 is mounted. On a second surface 16 of the wiring board 10, an electronic component 40 is mounted. A method of mounting the semiconductor chip 20 and the electronic component 40 is not particularly restricted and any known methods may be applied. At this time, the semiconductor chip 20 and the electronic component 40 may be electrically connected with the wiring pattern 12. For instance, as shown in FIG. 5, after a resin paste is disposed on the first surface 14 of the wiring board 10, the semiconductor chip 20 may be mounted so that the pad 13 and the electrode 24 may face each other. Then, by curing the resin paste, the semiconductor chip 20 may be mounted on the wiring board 10. Thereafter, on the second surface 16 of the wiring board 10, the electronic component 40 may be mounted. As shown in FIG. 6, the electronic component 40 may be mounted on the pad 15.

Figure 7:
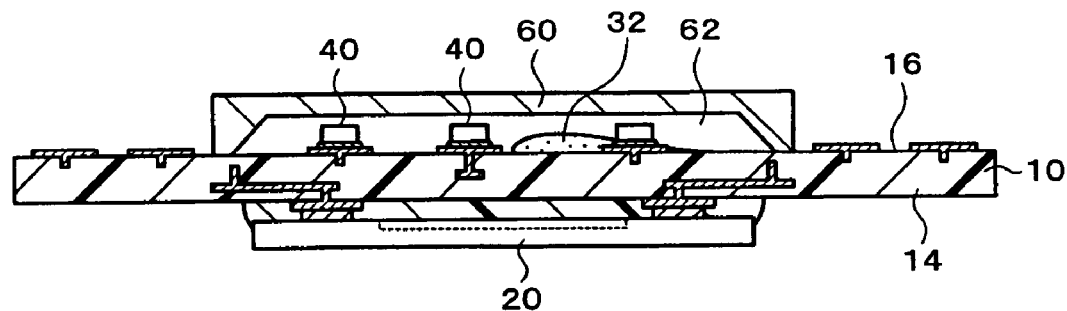
FIG. 7 is a diagram showing still another method of manufacturing a semiconductor device according to an embodiment thereto the present invention is applied.

A method of manufacturing a semiconductor device according to an embodiment of the present invention includes forming, on the second surface 16, a spacer 30 that seals the electronic component 40. A method of forming the spacer 30 is not particularly restricted. For instance, a spacer 30 may be formed according to a molding process. In more detail, as shown in FIG. 7, after a molding die 60 is set to the wiring board 10, a resin paste 32 is filled in a cavity 62 followed by curing, and thereby a spacer 30 may be formed. Alternatively, according to a potting process, a spacer 30 may be formed. In more detail, after a resin paste is dropped on the second surface 16 of the wiring board 10, it may be cured to form a spacer 30. At this time, according to a leveling process, the height of the spacer 30 may be controlled or a top end surface of the spacer 30 may be made a planar surface. A material (resin paste 32) of the spacer 30 is not particularly restricted.

A method of manufacturing a semiconductor device according to an embodiment of the present invention may include disposing an external terminal 50 on the second surface 16. The external terminal 50 may be disposed so as to electrically connect with the wiring pattern 12. The external terminal 50 may be disposed on the pad 17 (FIG. 1). At this time, the external terminal 50 may be formed so as to have a height higher than that of the spacer 30. Then, after, undergoing an inspection process and a marking process, the semiconductor device 1 shown in FIG. 1 may be manufactured.

MODIFICATION EXAMPLE

In what follows, a modification example of a semiconductor device according to an embodiment thereto the present invention is applied will be explained. In the following modification example, contents mentioned above are applied as far as possible.

Figure 8:
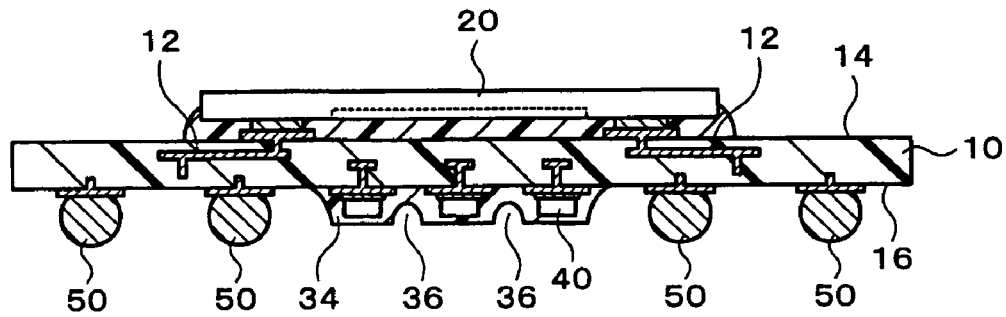
FIG. 8 is a diagram for explaining a modifed example of a semiconductor device according to an embodiment thereto the present invention is applied.
Figure 9:
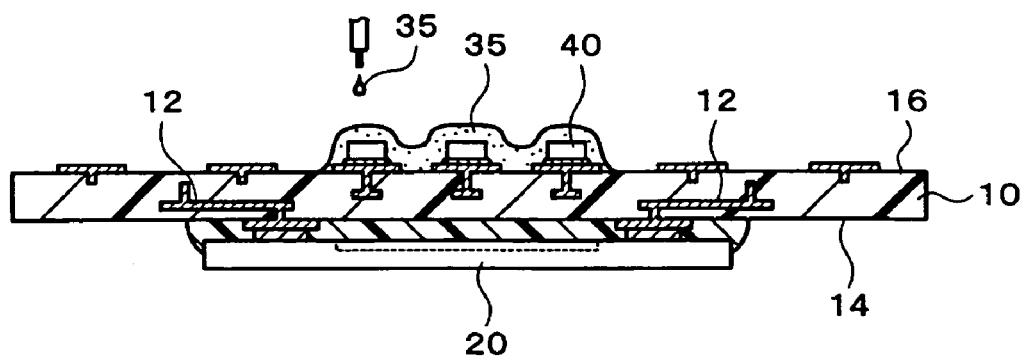
FIG. 9 is a diagram for explaining another modified example of a semiconductor device according to an embodiment thereto the present invention is applied.

In an example shown in FIG. 8, a semiconductor device has a spacer 34. The spacer 34 has a recess 36. In more detail, on a surface opposite to a surface that faces a wiring board 10 in the spacer 34 the recess 36 is formed. The spacer 34 as well can exhibit an effect similar to that of the spacer 30. Furthermore, since an amount of a material used for the spacer 34 can be reduced, a manufacturing cost of the semiconductor device can be suppressed low. At this time, as shown in FIG. 8, the recess 36 may be disposed avoiding a region that overlaps with the electronic component 40. A process of forming the spacer 34 may include a potting process. That is, as shown in FIG. 9, on the second surface 16 of the wiring board 10, a resin paste 35 may be dropped. Then, after undergoing a process of curing or leveling this, the spacer 34 may be formed. At this time, an amount of the resin paste 35 that is dropped on the wiring board 10 may be controlled to form the spacer 34 with a recess 36.

Figure 10:
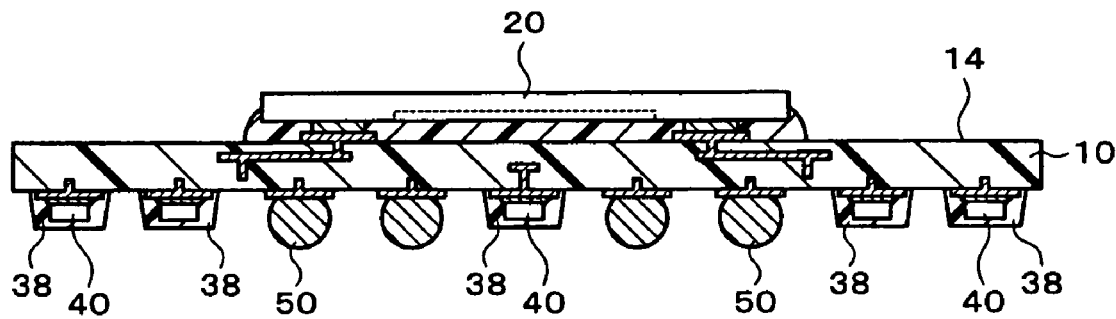
FIG. 10 is a diagram for explaining still another modified example of a semiconductor device according to an embodiment thereto the present invention is applied.

In an example shown in FIG. 10, on a second surface 16 of a wiring board 10, a plurality of spacers 38 is disposed. According to this, the respective spacers 38 can be made smaller. In more detail, since there is no need of sealing all of the electronic components 40 with one spacer, the respective spacers 38 can be made smaller. Accordingly, a degree of freedom of disposition of the spacer 38 becomes high. The spacers 38 each have, inside thereof, an electronic component 40. As shown in FIG. 10, the spacers 38 each may have, inside thereof, only one electronic component 40. Alternatively, the spacers 38 each may have, inside thereof, a plurality of electronic components 40 (not shown in the drawing). The spacers 38 may be formed by, for instance, mold sealing the respective electronic components 40.

The present invention, without restricting to the above-mentioned embodiments, may be variously modified. For instance, the invention includes a configuration (such as a configuration same in the function, method and result, or a configuration the same in the advantage and effect) substantially same as that explained in the embodiment. Furthermore, the invention includes a configuration in which a portion that is not essential to the configuration explained in the embodiment is replaced. Still furthermore, the invention includes a configuration that can exhibit an operational effect the same as that of the configuration explained in the embodiment or a configuration that can attain the same advantage. Furthermore, the invention includes a configuration in which a known technique is added to the configuration explained in the embodiment.

The invention claimed is:

1. A semiconductor device, comprising:
    a wiring board having a wiring pattern;
    a semiconductor chip that has an integrated circuit and is mounted on a first surface of the wiring board to electrically connect with the wiring pattern;
    an electronic component mounted to a second surface of the wiring board and electrically connected with the wiring pattern;
    a resin spacer formed on the second surface of the wiring board to overlie and seal the electronic component, wherein the spacer is formed with a recess on a surface opposite to a surface that faces the wiring board; and
    an external terminal that is disposed on the second surface and electrically connected with the wiring pattern, wherein the external terminal has a height higher than that of the spacer.

2. A circuit board on which the semiconductor device according to claim 1 is mounted.

3. An electronic device comprising said semiconductor device according to claim 1.

4. A semiconductor device comprising:
    a wiring board having a wiring pattern;
    a semiconductor chip that has an integrated circuit and is mounted on a first surface of the wiring board to electrically connect with the wiring pattern;
    a spacer that is disposed on a second surface of the wiring board and has inside thereof an electronic component that is electrically connected with the wiring pattern; and an external terminal that is disposed on the second surface and electrically connected with the wiring pattern, wherein the external terminal has a height higher than that of the spacer, and wherein on a surface that is opposite to a surface that faces the wiring board in the spacer a recess is formed.

5. The semiconductor device according to claim 4, wherein the recess is disposed avoiding a region that overlaps with the electronic component.

6. A method of manufacturing a semiconductor device comprising:

preparing a wiring board having a first surface of which a semiconductor chip is mounted and having a second surface of which an electronic component is mounted;

forming on the second surface a spacer that seals the electronic component, wherein the spacer is formed so as to have a recess on a surface opposite to a surface that faces the wiring board; and disposing an external terminal on the second surface that has a height higher than that of the spacer.

7. The method of manufacturing a semiconductor device according to claim 6, wherein the spacer is formed so as to be disposed avoiding a region where the recess overlaps with the electronic component.

8. A semiconductor device comprising:

a wiring board having a wiring pattern;

a semiconductor chip that has an integrated circuit and is mounted on a first surface of the wiring board to electrically connect with the wiring pattern;

means for housing an electronic component that is electrically connected with the wiring pattern disposed on a second surface of the wiring board; and an external terminal that is disposed on the second surface and electrically connected with the wiring pattern, wherein the external terminal has a height higher than that of the spacer, and wherein on a surface that is opposite to a surface that faces the wiring board in the means for housing a recess is formed.

9. The semiconductor device according to claim 8, wherein the recess is disposed avoiding a region that overlaps with the electronic component.

* * * * *